Dec. 8, 1970 B. PALLEIKO 3,546,631

PULSED COHERENT OSCILLATOR

Filed Sept. 5, 1968

INVENTOR.
BENJAMIN PALLEIKO

BY Richard S. Seligman

ATTORNEY

United States Patent Office 3,546,631

Patented Dec. 8, 1970

3,546,631

PULSED COHERENT OSCILLATOR

Benjamin Palleiko, Norwood, Mass., assignor to Sanders Associates, Inc., Nashua, N.H., a corporation of Delaware No Drawing. Filed Sept. 5, 1968, Ser. No. 761,008

Int. Cl. H03b *5/00*

U.S. Cl. 331—172 5 Claims

ABSTRACT OF THE DISCLOSURE

Ultra-high frequency pulsed oscillators having pulse-to-pulse coherency are herein disclosed. In one embodiment an oscillator employing strip-line circuitry is gated on by a switching transistor which is turned-on by a fast rise time drive pulse.

BACKGROUND OF THE INVENTION

Electronic pulse generators which generate short ultra-high frequency pulses have many commercial and military applications. They may, for example, be used in altimeters, radar systems, radio fuzes, electronic scoring systems, moving vehicle counters and the like. Presently available devices, however, are in many respects inadequate. For instance, the method of gating the beam of a travelling wave tube amplifier to provide short ultra-high frequency pulses is ineffective to provide pulse-to-pulse coherency RF switches have been used to generate short ultra-high frequency pulses, however, the pulses generally are non-coherent unless very complicated synchronism schemes are employed.

SUMMARY OF THE INVENTION

Accordingly, it is an object of this invention to provide a new and improved pulsed ultra-high frequency oscillator.

It is another object of this invention to provide an ultra-high frequency oscillator employing strip-line circuitry.

It is a further object of this invention to provide a pulsed oscillator having pulse-to-pulse coherency.

It is yet another object of this invention to provide a solid state pulsed coherence oscillator having fast rise and fall times.

Briefly, a common collector oscillator is gated by a switching transistor in the emitter circuit. With a fast rise time driving pulse, the oscillator starts with constant phase producing a coherent pulse. In another embodiment a similar drive circuit is used in the base circuit.

BRIEF DESCRIPTION OF THE DRAWINGS

The above-mentioned and other features and objects of this invention will become more apparent by reference to the following description taken in conjunction with the accompanying drawings, in which.

DESCRIPTION OF PREFERRED EMBODIMENTS

Figure 1:
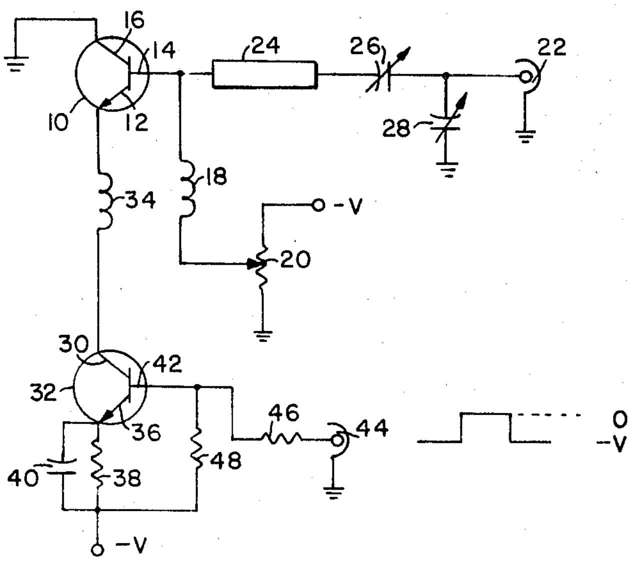
FIG. 1 is a schematic diagram of a pulsed coherent ultra-high frequency oscillator.

Referring now to FIG. 1 there is illustrated thereby a schematic of a pulsed coherent oscillator constructed according to the invention. The pulsed coherent oscillator comprises a transistor 10 having emitter 12, base 14 and collector 16 electrodes. Collector 16 is coupled to ground. Base 14 is coupled to a biasing voltage —V via an RF choke 18 and a potentiometer 20 and also coupled to the output 22 of the oscillator by way of a section of strip-line 24 and a variable capacitor 26. Output 22 is also coupled to ground by way of a variable capacitor 28. The emitter 12 of transistor 10 is coupled to the collector 30 of a drive transistor 32 via an RF choke 34. The emitter 36 of drive transistor 32 is coupled to a —V supply via a resistor 38. A capacitor 40 is coupled across resistor 38. The base 42 of transistor 32 is coupled to the input 44 of the circuit by way of a resistor 46 and coupled to the —V supply via a resistor 48.

Transistor 10 and its associate circuitry comprises an oscillator. The RF choke 34, strip-line element 24 and capacitor 26 are tuned to the operating frequency. Although the use of strip-line element 24 is preferred, in lower frequency applications a lumped inductive element could be substituted therefor. Capacitors 26 and 28 are also selected to match the output to the load. Strip-line element 24 also provides a portion of the matching circuit between the oscillator and the load.

Potentiometer 20 provides a bias adjustment for setting the operating point of transistor 10 which effects the pulse shape at output 22. RF choke 18 merely supplies AC decoupling.

When an input pulse is applied at input 44, transistor 32 is turned-on causing emitter 12 of transistor 10 to be pulled negative and, thus, causing the oscillator to start on a negative going RF cycle. The oscillator will start with a constant starting phase each time it is turned-on. In the example shown, the starting phase is negative. If PNP transistors were employed and the drive pulse was negative, of course, the starting phase would be positive each generated pulse.

Figure 3:
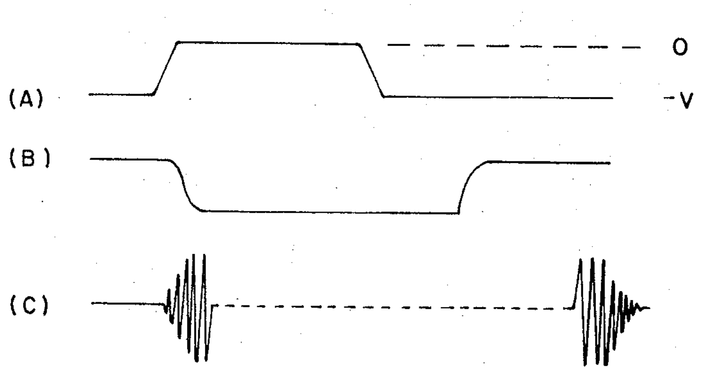
FIG. 3 is a series of waveforms illustrating the relationship between some of the pulses as they appear in the oscillator of FIG. 1.

The waveforms of FIG. 3 are illustrative of the type generated by the circuit of FIG. 1, however, they are not to scale, but are merely set forth for explanation purposes. Waveform (A) illustrates the drive pulse which is applied at input 44. In order to have coherency the rise time for the pulse applied to transistor 10 is typically less than five nanoseconds.

This drive pulse turns on transistor 32. Resistor 38 limits the current through transistor 32. Capacitor 40 improves the switching speed of transistor 32 since initially capacitor 40 looks like a short circuit and, therefore, provides base overdrive for transistor 32 providing optimized risetime to drive transistor 10. Waveform (B) illustrates the signal at collector 30 of transistor 32. Waveform (A) in this example has a risetime equal to or greater than five nanoseconds while the risetime of pulse (B) is less than five nanoseconds. The RF pulse output taken at output 22 of FIG. 1 is illustrated as waveform (C) of FIG. 3.

This circuit has unique applicability for applications requiring short coherent bursts of RF energy such as pulsed doppler short range radar systems. The output pulses are coherent.

A typical set of values for the components of FIG. 1 for operating around 1300 mc. are as follows:

| | |
|---|---|
| Transistor **10** | Motorola MM8002. |
| Transistor **32** | 2N3014. |
| Capacitor **26** | 0.8→ 10 pf. |
| Capacitor **28** | 0.3→ 3 pf. |
| Choke **18** | 0.1 μhy. |
| Choke **34** | 0.1 μhy. |
| Resistor **38** | 50 ohms. |
| Resistor **48** | 300 ohms. |
| Resistor **46** | 100 ohms. |
| Resistor **20** | 5k. |

The strip-line element 24 is on the order of ¾ inch long and $^3/_{16}$ inch wide.

Figure 2:
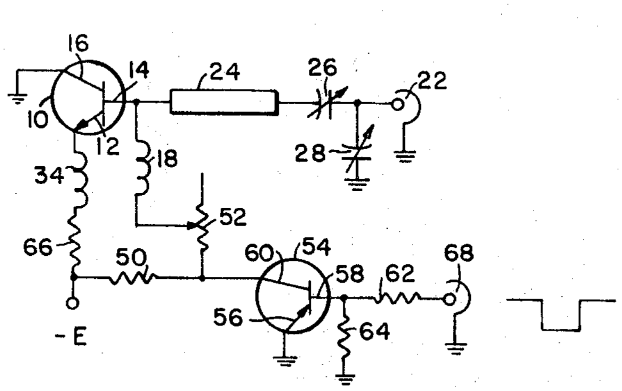
FIG. 2 is a schematic diagram of a second embodiment of a pulsed coherent ultra-high frequency oscillator.

A second embodiment of this invention is set forth in FIG. 2. This embodiment is very similar to that of FIG. 1. In this embodiment the base of transistor 10 is switched.

The emitter 12 of transistor 10 is coupled to a —E voltage source via an RF choke 34 and a resistor 66 and to the collector 60 of a transistor 54 via RF choke 34 resistor 66 and a resistor 50. Collector 60 of transistor 54 is coupled to the base 14 of transistor 10 via potentiometer 52 and RF choke 18. The emitter 56 of transistor 54 is grounded and the base 58 thereof is coupled to ground via a resistor 64 and to the circuit input 68 via a resistor 62. Thus, with no negative drive pulse being applied at input 68, transistor 10 is hard off and no RF is generated. When a drive pulse is applied at input 68, transisor 56 turns on, the end of potentiometer 52 is, therefore, grounded and transistor 10 is brought into the operating region thereof causing an RF output at 22.

While I have described the principles of my invention in connection with specific apparatus, it is to be clearly understood that this description is made only by way of example and not as a limitation on the scope of my invention as set forth in the appended claims.

I claim:

1. An ultra-high frequency oscillator for producing short coherent pulses, comprising:

an oscillator circuit including a common collector oscillator;

a voltage source;

a switching circuit coupling said voltage source to said oscillator circuit, said switching circuit including a transistor having first, second and third electrodes, said first electrode being coupled to said voltage source and said third electrode being coupled to said oscillator circuit; and means for turning on said switching circuit coupled to said second electrode of said transistor of said switching circuit.

2. An ultra-high frequency oscillator for producing short coherent pulses, comprising:

an oscillator circuit including a common collector oscillator having base emitter and collector electrodes;

a voltage source coupled to said emitter electrode;

a switching circuit including a transistor having first, second and third electrodes, said first electrode being coupled to said voltage source and to the base of said common collector oscillator and said third electrode being coupled to ground; and means for turning on said switching circuit coupled to said second electrode of said transistor of said switching circuit whereby said common collector oscillator is brought into its operating region causing it to oscillate.

3. An ultra-high frequency oscillator as defined in claim 1, said switching circuit further including a capacitor coupled from said first electrode to said voltage source.

4. An ultra-high frequency oscillator as defined in claim 3, wherein said oscillator circuit includes a tank circuit having as one element thereof a strip-line element.

5. An ultra-high frequency oscillator as defined in claim 4, further including an RF choke coupling said switching circuit to said oscillator circuit.

References Cited

UNITED STATES PATENTS

| | | | |
|---|---|---|---|
| 3,225,313 | 12/1965 | Rexroad | 331—173 |
| 3,309,624 | 3/1967 | Allen | 331—117 |
| 3,332,031 | 7/1967 | Reid | 331—173 |
| 3,355,677 | 11/1967 | Egan | 331—173 |

RODNEY D. BENNETT, Primary Examiner
W. T. RIFKIN, Assistant Examiner

U.S. Cl. X.R.

331—117